United States Patent [19]

Miura

[11] 4,163,211
[45] Jul. 31, 1979

[54] TREE-TYPE COMBINATORIAL LOGIC CIRCUIT

[75] Inventor: Kenichi Miura, Saratoga, Calif.

[73] Assignee: Fujitsu Limited, Japan

[21] Appl. No.: 897,132

[22] Filed: Apr. 17, 1978

[51] Int. Cl.² .......................... G06F 7/02; G06F 7/50; G06F 11/10

[52] U.S. Cl. .................. 340/146.2; 364/738; 364/787

[58] Field of Search ............. 340/146.2; 364/787, 364/738, 716

[56] References Cited

U.S. PATENT DOCUMENTS

| | | | |
|---|---|---|---|
| 3,604,909 | 9/1971 | Vogel et al. | 340/146.2 X |
| 3,619,583 | 11/1971 | Arnold | 364/716 |
| 3,700,875 | 10/1972 | Saenger et al. | 364/787 |
| 3,938,087 | 2/1976 | Louie | 340/146.2 |
| 4,084,253 | 4/1978 | Miller | 364/738 |

*Primary Examiner*—David H. Malzahn
*Attorney, Agent, or Firm*—Schatzel & Hamrick

[57] ABSTRACT

A tree-type combinatorial logic circuit comprising a plurality of identical functional units which may be arranged to operate as an N-bit magnitude comparator, a carry generator for an N-bit adder, or a parity predictor for 2N-bit binary counter. Each of the units is provided with four input terminals and two output terminals. The units are arranged to form a binary tree. Each unit has an internal logic circuit which generates outputs of $G_{K^*l}=G_K V E_K\cdot g_l$ and $E_{K^*l}=E_K\cdot E_l$, where "V" and "·" denote Boolean OR and AND operations, respectively. The desired functions are provided at the output terminals of the unit in the final stage of the tree.

The input signals to the units in the first stage of the tree depend on the applications of the circuit. When used as a magnitude comparator, the inputs are $a_i\cdot\bar{b}_i$'s and $a_i\oplus b_i$'s ($i=0, 1,..., N-1$), where $a_i$ and $b_i$ are the i-th bits of the two binary words (each N bits long) to be compared, and $\oplus$ represents the Boolean exclusive NOR function. When used as a carry generator, the inputs are $a_i\cdot b_i$'s and $a_i\oplus b_i$'s ($i=0, 1, ..., N-1$), where $a_i$ and $b_i$ are the i-th bits of two binary words (each N bits long) to be added and $\oplus$ represents the Boolean exclusive OR operation. When used as a parity predicator, the inputs are $\bar{b}_i$'s ($i=N-1, N-3, N-5, ..., 1$ while non-negative) and $b_i$'s ($i=N-2, N-4, ...,$) while non-negative, where $b_i$ is the i-th bit of any binary number (N bits long, $b_o$ is the most significant bit) to be incremented by 1 by a binary counter.

13 Claims, 9 Drawing Figures

Fig_1

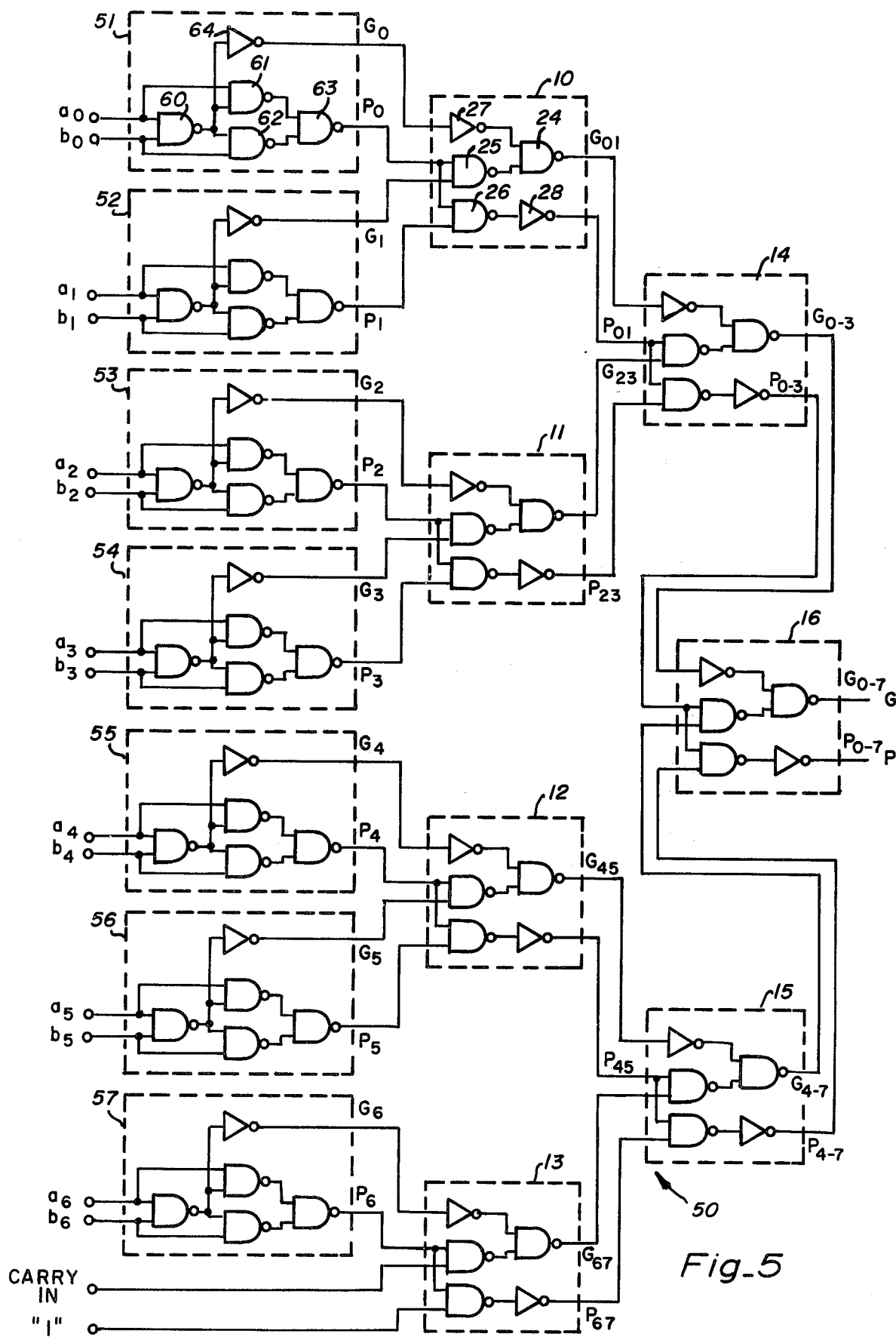
Fig_5

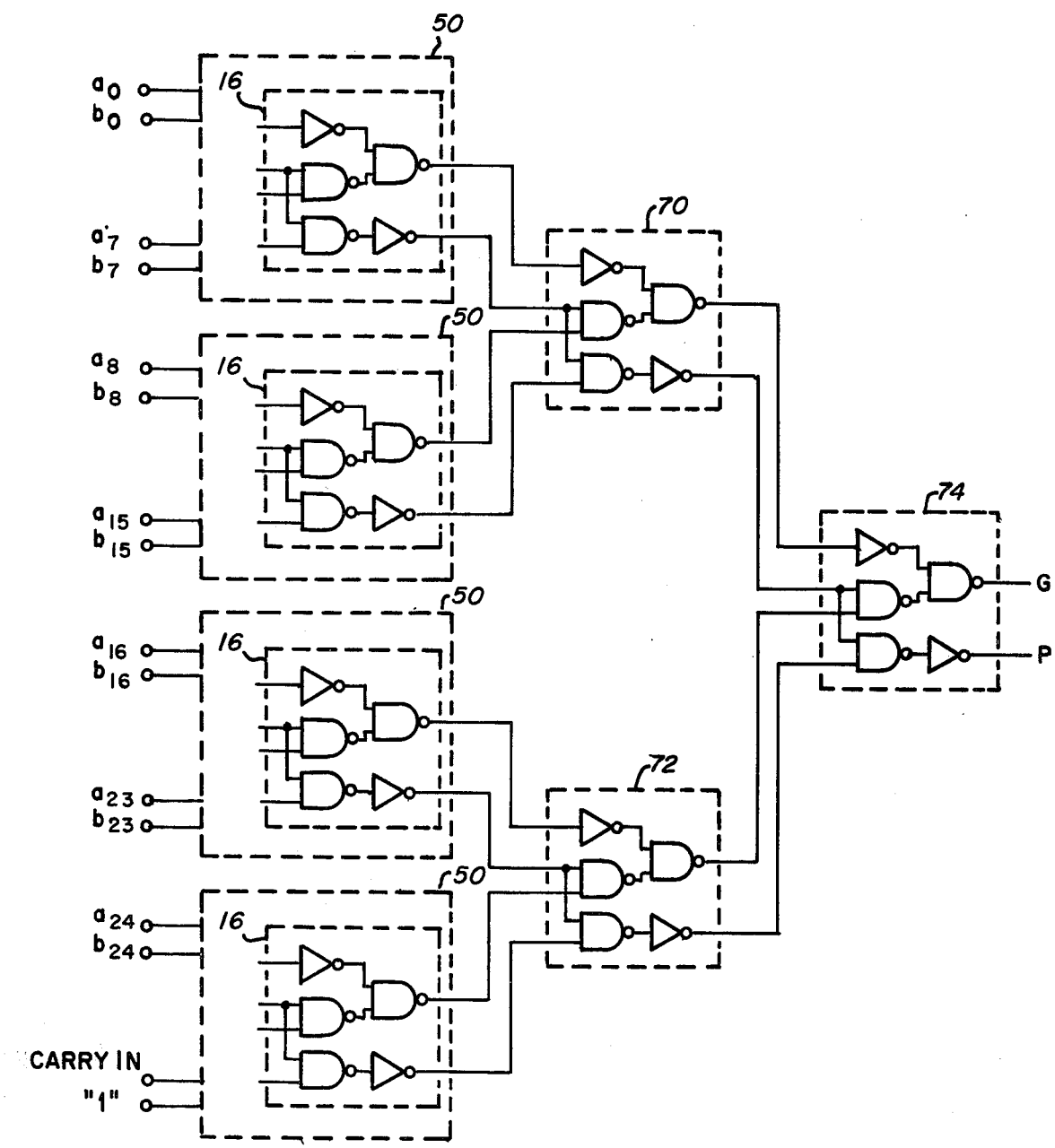
Fig_6

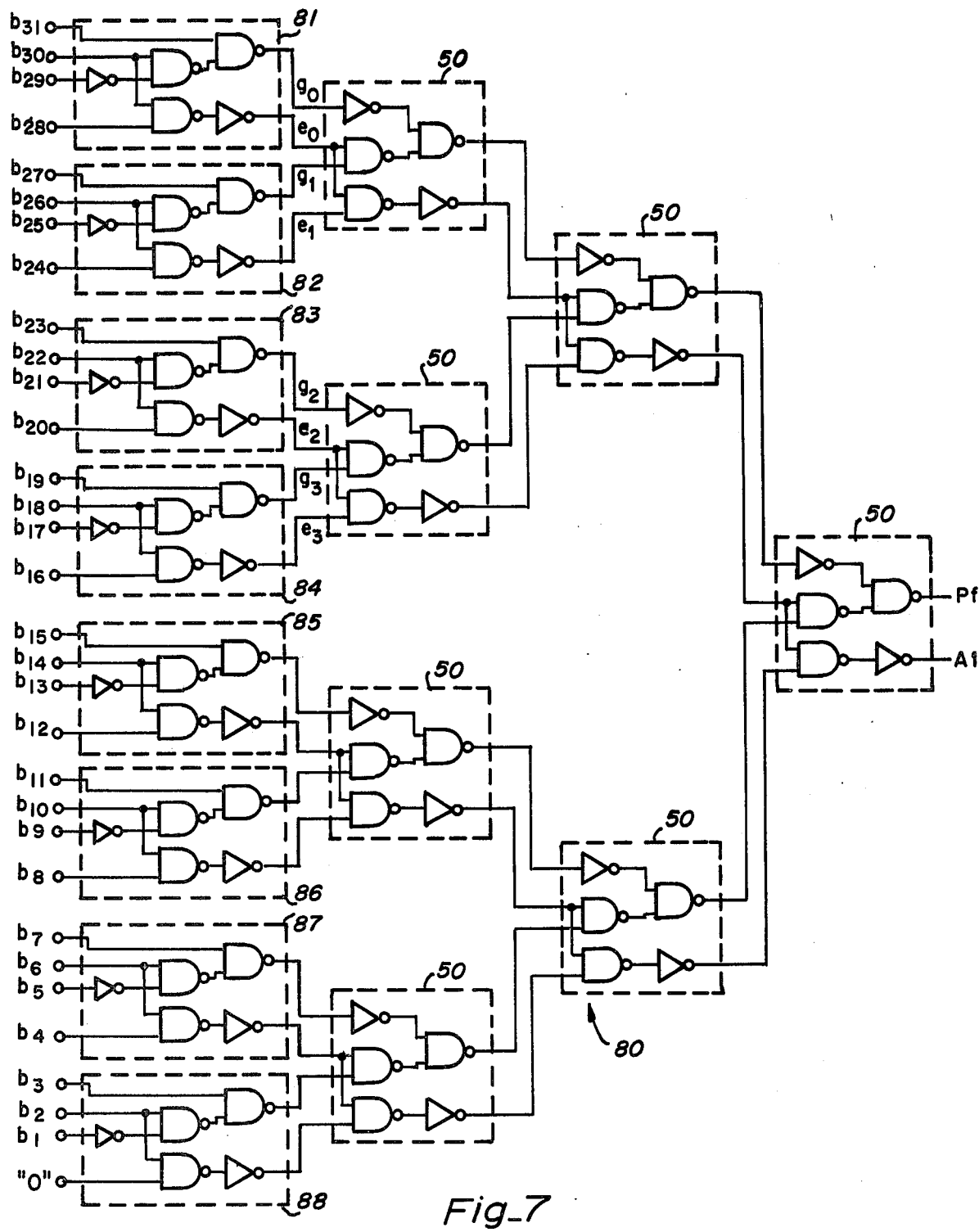
Fig_7

TREE-TYPE COMBINATORIAL LOGIC CIRCUIT

BACKGROUND OF THE INVENTION

1. Field of the Invention

The present invention relates to tree-type combinatorial logic circuits and more particularly to derivation of the tree-type logic circuits from iterative combinatorial logic circuits which can be described by certain Boolean recurrence formula.

2. Description of the Prior Art

Boolean recurrence formula can be translated into logic circuits by connecting identical, properly designed logic units in cascade; that is, iterative combinatorial logic circuits.

The formulas under consideration are as follows:

$$G_{K+1} = G_K V E_K g_{K+1},$$

and $$E_{K+1} = E_K \cdot e_{K+1},$$

where ($g_K$, $e_K$) are inputs at the k-th stage to be defined depending on applications; ($G_K$, $E_K$) are outputs at the k-th stage; and "V" and "·" denote Boolean OR and AND operations, respectively, where $k = 0, 1, \ldots N-1$.

Logic circuits such as N bit magnitude comparators, N bit group carry generators and 2 N bit parity prediction circuits for the counter can all be described by the above recurrence formulas.

With such circuits, the delay time of N-staged iterative logic circuits becomes unpractically large as N increases.

It is possible to build look-ahead type circuits to accomplish the above recurrence relations. However, such a look-ahead scheme requires logic gates with large fan-ins as well as complex, irregular interconnection of wires, and are not necessarily the optimum design for the large scale integrated (LSI) circuit applications.

SUMMARY OF THE INVENTION

An object of the present invention is to provide a tree-type logic circuit performing a function given by the aforesaid recurrence formula.

A further object is to provide a tree-type logic circuit which operates faster than ripple circuits as the number of inputs increases.

Another object is to provide a tree-type logic circuit which functions as a magnitude comparator depending on the signal to the first input stages.

Still another object is to provide a tree-type logic circuit which may be adapted to function as a carry generator depending on the signal to the first input stage.

Still another object is to provide a tree-type logic circuit which functions as a prediction circuit depending upon the nature of the input signal to the first stage.

Briefly, a preferred embodiment of the present invention includes a logic circuit described by certain recurrence function and achieved by a tree-type logic circuit. In the tree-type logic circuit a plurality of cascading circuits each having similar logic gates can be used. The plurality of cascading circuits are provided with four input terminals and two output terminals and are arranged to build the tree circuit. Although the Boolean functions of each cascading circuit in the tree-type configuration are identical to those of the iterative linear array, indexing will be made different to avoid confusion. More explicitly, when the first signal $G_K$, a second signal $E_K$, a third signal $g_l$ and a fourth signal $e_l$ are applied to the four input terminals respectively, each of the cascading circuits perform the functions $E_{K*l} = E_K \cdot e_l$ and $G_{K*l} = G_K V E_K \cdot g_l$ where * means cocatination of two indices. For example, if K=2, l=3, K*l=23. In some instances, cocatinations of more than two indices are abbreviated by using only the first index and the last index connected by "—sign" if this causes no confusion. For example, 0*1*2*3 can be abbreviated as 0–3. The desired output functions are explicitly presented at the output terminals in the final stage of the tree.

When adapted to function as a magnitude comparator, the first and third signals to the ith cascading circuits in the first stage are generally provided with a function of $g_i = a_i \overline{b_i}$, $g_{i+1} = a_{i+1} \overline{b_{i+1}}$ and the second and fourth signals in the first stage are generally provided with a function $e_i = a_i \oplus b_i = a_i b_i V \overline{a_i b_i}$, and $e_{i+1} = a_{i+1} \oplus b_{i+1}$ wherein $a_i$ and $b_i$ are the i-th bits of binary words to be compared and "i" ranging from 0, 2, 4, . . . to an integer not exceeding $(N-1)/2$.

At the output terminals in the final stage of the tree circuit the fully expanded Boolean functions become $$G = g_0 V e_0 g_1 V e_0 e_1 g_2 V \ldots V e_0 e_1 e_2 \ldots e_{N-2} g_{N-1};$$

and $$E = e_0 e_1 e_2 \ldots e_{N-1}.$$

In a carry generator, the first and third signals in the first stage are generally provided with a function $g_i = a_i \cdot b_i$, $g_{i+1} = a_{i+1} \cdot b_{i+1}$ and the second and fourth signals in the first stage are generally provided with a function $e_i = a_i \oplus b_i$ and $e_{i+1} = a_{i+1} \oplus b_{i+1}$. Finally, a carry generator signal will be given by the Boolean function G and an "all-propagate" signal will be given by the function E.

In a parity prediction circuit, data bits are supplied to the circuit with alternating polarity, starting with $\overline{b_{N-1}}$, where $b_{N-1}$ is the least significant bit of the data bits. The parity of the original data bits will be flipped only when the function F in the following form becomes 1;

$$F = \overline{b_{N-1}} V b_{N-2} \overline{b_{N-3}} V b_{N-2} b_{N-4} \overline{b_{N-5}} V b_{N-2} b_{N-4} b_{N-6} \overline{b_{N-7}} V \ldots$$

An "all even bits 1" signal will be given by the function E.

The tree is not balanced in general, i.e., not fully symmetric, unless the number of inputs are some power of 2. A method of finding the shape of unbalanced trees may be described as follows. As for the magnitude comparator and the carry generator, the input words may be appended with trailing zeros until the total number of bits becomes some power of 2 for the first time, for example $2^\gamma$. Then all the $2^\gamma$ inputs are fed into the tree logic circuits of the appropriate size and unnecessary logic blocks are eliminated to obtain an unbalanced tree circuit. For the parity prediction circuit, the inputs are $b_{N-1}$, $b_{N-2}$, ... $b_1$, $b_0$ for the N-bit counter. The polarity of every other bit is flipped starting $\overline{b_{N-1}}$, before they are fed into the tree logic and $b_0$ is replaced by 0 if N is even. These modified inputs are appended with leading zeros until the total number of bits becomes some power of 2, for example $2^\gamma$. Then all the $2^\gamma$ inputs are fed into the tree logic circuit of the appropriate size, and unnecessary logic blocks are eliminated to obtain an unbalanced tree logic circuit.

The aforesaid parity prediction circuit can be used either as the parity generator for the +1 counters, or can be used to check the operations of the +1 counters by comparing the predicted parity with the actually generated parity at the output of the counters.

The aforesaid tree circuit has a logarithmically increasing gate delay as the number of input bits increases so that it can operate very fast as compared with an iterative circuit designed to perform the same function.

Furthermore, the tree circuit can be built with a plurality of single circuit units of standard terminal arrangement. These high speed circuits and simplicity of circuit connection are highly appreciated in practical applications.

These and other objects and advantages of the present invention will no doubt become apparent after a reading of the following detailed description of the preferred embodiments which are illustrated in the several figures of the drawing.

IN THE DRAWING

FIG. 5 is a functional block diagram of a seven-bit carry generator in accordance with the present invention;

FIG. 6 is a functional block diagram of a 31-bit carry generator in accordance with the present invention;

FIG. 7 is a functional block diagram of a 32-bit parity prediction circuit in accordance with the present invention;

DETAILED DESCRIPTION OF THE PREFERRED EMBODIMENT

Figure 1:
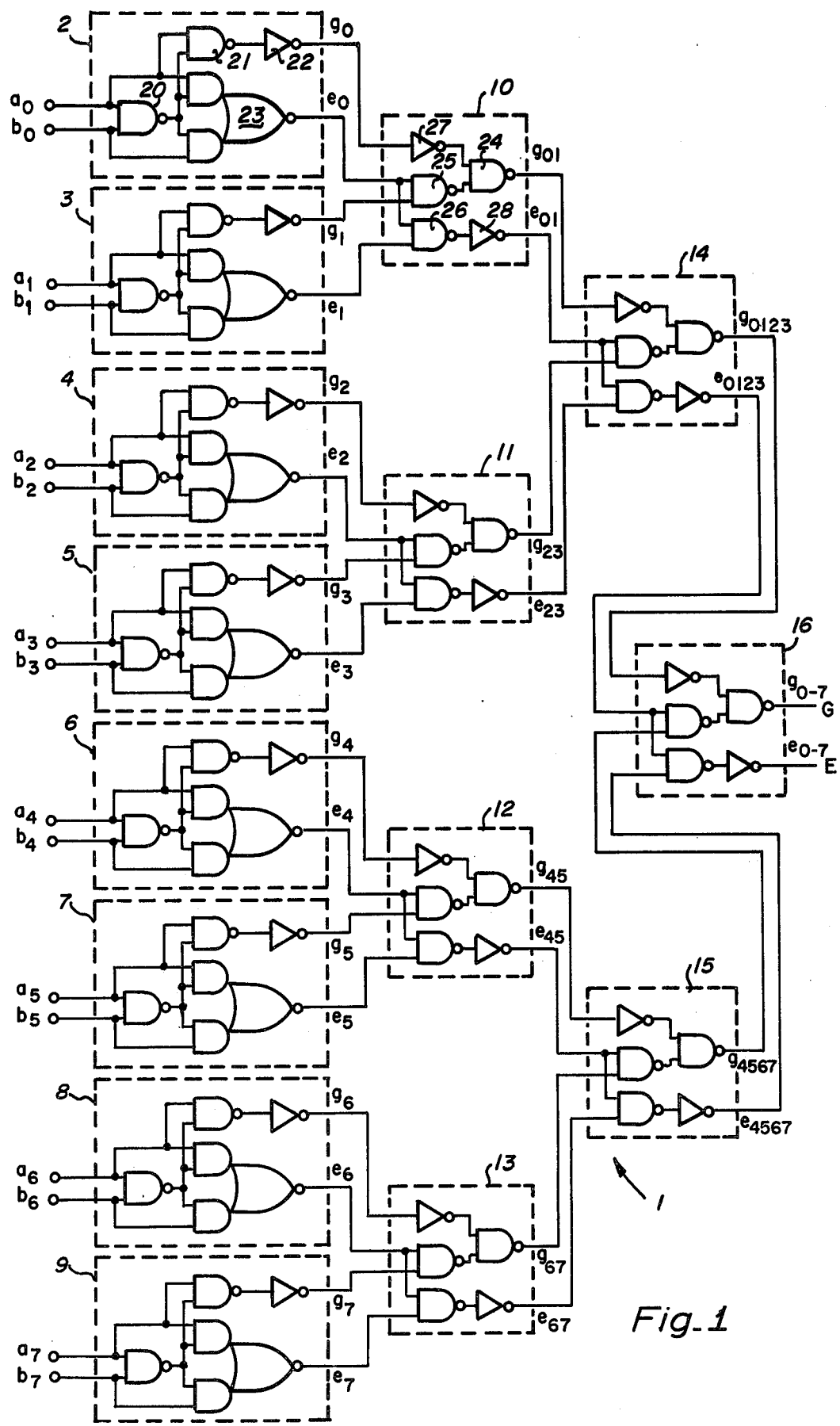
FIG. 1 is a functional block diagram of an eight-bit magnitude comparator in accordance with the present invention.

FIG. 1 is a functional block diagram of an eight-bit magnitude comparator referred to by the general reference character 1, and incorporating the present invention. The comparator 1 is adapted to receive two binary input words A and B comprised of bits $a_0$ through $a_7$ and $b_0$ through $b_7$, respectively, where $a_0$ and $b_0$ are the most significant bits. The comparator enables one of two outputs (G or E) indicating whether A is greater than B (A>B) or A is equal to B (A=B). If A is less than B, no output is enabled.

The comparator 1 is comprised of eight identical one-bit comparators, 2-9 and seven identical cascading circuits, 10-16. The cascading circuits 10-16 are arranged in three stages in a tree-type arrangement.

Each of the one-bit comparators 2-9, is comprised of two NAND gates 20 and 21, one inverter gate 22 and one AND-OR-inverter gate 23 which are obtainable in both bipolar and metal oxide semiconductor (MOS) devices including complementary MOS (CMOS). Each of the one-bit comparators, 2-9, generate two output signals $g_i$ and $e_i$ with $g_0$ and $e_0$, . . . , $g_7$ and $e_7$ being the pair of output bits for the comparators, 2-9, respectively.

Assuming that the arbitrary bits of input to the comparators, 2-9, are a and b, the outputs g and e of one bit comparators may be basically expressed as $$g = a\bar{b},$$

and $$e = a \oplus b = ab V \overline{ab}.$$

Therefore the outputs of G and E of the comparator 16 in the final stage of the tree circuit are expressed as $$G = g_0 V e_0 g_1 V e_0 e_1 g_2 V \ldots V e_0 e_1 e_2 e_3 e_4 e_5 e_6 g_7;$$

and $$E = e_0 e_1 e_2 e_3 e_4 e_5 e_6 e_7.$$

For this purpose, the NAND gate 20 of each comparator generates $\overline{ab}$, the NAND gate 21 generates $\overline{a\,\overline{ab}} = \overline{ab}$, and the inverter 22 generates $a\bar{b}$ resulting in g. The AND-OR-INVERTER 23 also receives the $\overline{ab}$ signal and generates a signal of $\overline{a \cdot \overline{ab} \, V \, b \, \overline{ab}}$ which transforms into $ab V \bar{a}\bar{b}$ resulting in e.

Each of the cascading circuits 10-16 in the cascading stage, include three NAND gates 24 to 26 and two inverter gates 27 and 28, respectively. The cascading circuit 10 receives the outputs $g_0$, $g_1$ and $e_0$, $e_1$ of the pair of one-bit comparators 10 and 11. The NAND gate 24 is supplied the outputs $\overline{g_0}$ and $\overline{e_0 g_1}$ and generates an output of $g_{01} = \overline{\overline{g_0} \cdot \overline{e_0 g_1}}$ which is transformed into $g_{01} = g_0 V e_0 g_1$. The inverter gate 28 generates an output of $e_{01}$. Similarly the cascading circuit 11 generates outputs of $g_{23}$ and $e_{23}$ which are expressed as $g_{23} = g_2 V e_2 g_3$ and $e_{23} = e_2 e_3$, respectively. The cascading circuit 12 generates outputs of $g_{45}$ and $e_{45}$ expressed as $$g_{45} = g_4 V e_4 g_5,$$

and $$e_{45} = e_4 e_5.$$

The cascading circuit 13 generates outputs of $g_{67}$ and $g_{67}$ expressed as $$g_{67} = g_6 V e_6 g_7,$$

and $$e_{67} = e_6 e_7.$$

The cascading circuit 14 in the second cascading stage generates outputs of $g_{0123}$ and $e_{0123}$ which are expressed as $$g_{0123} = g_{01} V e_{01} g_{23} = (g_0 V e_0 g_1) V e_0 e_1 (g_2 V e_2 g_3);$$

and $$e_{0123} = e_{01} \cdot e_{23} = e_0 e_1 e_2 e_3.$$

The cascading circuit 15 in the second cascading stage generates outputs of $g_{4567}$ and $e_{4567}$ which are expressed as $$g_{4567} = g_{45}Ve_{45}g_{67} = (g_4Ve_4g_5)Ve_4e_5(g_6Ve_6g_7),$$

and $$e_{4567} = e_{45} \cdot e_{67} = e_4e_5e_6e_7.$$

The cascading circuit 16 in the third cascading stage generates outputs of $g_{0-7}$ and $e_{0-7}$ which are expressed as follows:

$$\begin{aligned}
g_{0-7} &= g_{0123}Ve_{0123} \cdot g_{4567}, \\
&= g_{01}Ve_{01}g_{23}Ve_{01}e_{23}(g_{45}Ve_{45}g_{67}), \\
&= g_0Ve_0g_1 Ve_0e_1g_2 Ve_0e_1e_2g_3 Ve_0e_1e_2e_3g_4 Ve_0e_1e_2e_3e_4g_5 \\
&\quad Ve_0e_1e_2e_3e_4e_5g_6e_0e_1e_2e_3e_4e_5e_6g_7.
\end{aligned}$$

Thus, $G = g_{0-7}$.

$$\begin{aligned}
e_0 &= e_{0123} \cdot e_{4567}, \\
&= e_{01} \cdot e_{23} \cdot e_{45} \cdot e_{67}, \\
&= e_0e_1 \cdot e_2e_3 \cdot e_4e_5 \cdot e_6e_7.
\end{aligned}$$

Thus, $E = e_{0-7}$.

Therefore, the eight-bit magnitude comparator is built by eight one-bit comparators 2–9 generating two outputs g and e, four cascading circuits 10–13 in the first stage each of which is provided for comparing the outputs g and e of only two one-bit comparators, two cascading circuits 14 and 15 in the second stage each of which is provided for comparing the outputs of only two cascading circuits in the first cascading stage and one cascading circuit 16 in the third stage which is provided for comparing the outputs of only two cascading circuits in the second cascading stage.

From the above teachings it is apparent that a four-bit magnitude comparator may be constructed with four one-bit magnitude comparators, two cascading circuits, in the first stage, and one cascading circuit in the second stage.

A sixteen-bit magnitude comparator can be built using two sets of the eight-bit comparator illustrated by FIG. 1 and adding a cascading circuit to form a fourth cascading stage to the circuits 16.

Figure 2:
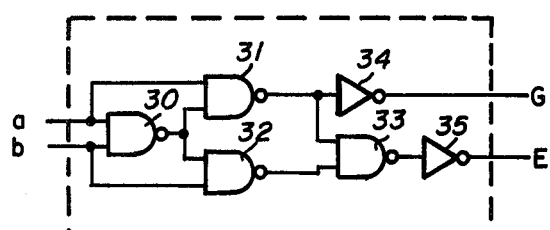
FIG. 2 is an alternative circuit for a one-bit comparator used in FIG. 1.
Figure 3:
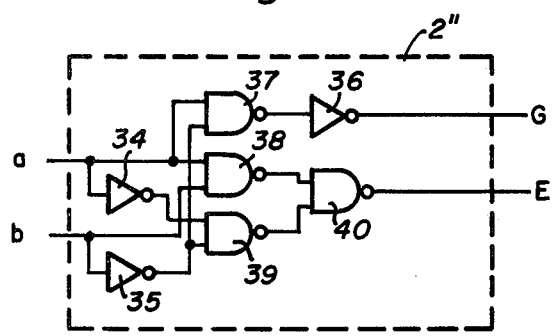
FIG. 3 is a further alternative circuit for a one-bit comparator used in FIG. 1.

FIG. 1 illustrates one embodiment for the one-bit comparators 2–8. FIGS. 2 and 3 illustrate alternative embodiments.

In FIG. 2 the comparator referred to as 2′; includes NAND gates 30, 31, 32 and 33, and two inverter gates 34 and 35. The gate 30 is adopted to receive the input signals a and b, the gate 31 to receive the signal a and output of gate 30, the gate 32 to receive the signal b and the output of the gate 30, the inverter 34 to receive the output of gate 31, the gate 33 to receive the output of gates 31 and 32 and the inverter 35 to receive the output of the gate 33 such that the inverters 34 and 35 provide the signals G and E, respectively.

Thus, in operation, the NAND gate 30 receives the signals a and b and generates $\overline{ab}$. The NAND gate 31 receives the signal a and $\overline{ab}$ to generate $\overline{aa\overline{b}}$ or $\overline{a\overline{b}}$. The NAND gate 32 receives the signal b and $\overline{ab}$ to generate $\overline{ba\overline{b}}$ or $\overline{\overline{b}a}$. The inverter 34 receives $\overline{a\overline{b}}$ and generates $a\overline{b}$ resulting in G. The NAND gate 33 receives $\overline{a\overline{b}}$ and $\overline{\overline{b}a}$ to generate $\overline{\overline{a\overline{b}} V \overline{ab}}$ which the inverter 35 responds to and generates $\overline{a\overline{b}} V \overline{\overline{a}b}$ which transforms into $\overline{a\overline{b} V \overline{a}b}$ resulting in the signal E.

In FIG. 3 a comparator 2″ includes three inverter gates 34, 35 and 36 and four NAND gates 37, 38, 39 and 40. The inverter 34 and NAND gates 37 and 38 receive the input signal a, while the inverter 35 and NAND gates 38 and 39 receive the input signal b. The NAND gate 37 also receives the output of the inverter 35 and the NAND gate 39 also receives the output of the inverter 34. The inverter 36 receives the output of the NAND gate 37 and the NAND gate 40 receives the output of the NAND gate 38 and 39. The output of the inverter 36 is the G signal and the output of the NAND gate 40 is the E signal.

Thus, in operation, the inverter 34 receives the signal a and generates $\overline{a}$. The inverter 35 receives the signal b and generates $\overline{b}$. The NAND gate 37 receives the signal a and $\overline{b}$ and generates $\overline{a\overline{b}}$ which the inverter 36 receives and generates $a\overline{b}$ resulting in signal G. The NAND gate 38 receives the signals a and b and generates $\overline{ab}$. The NAND gate 39 receives the signals $\overline{a}$ and $\overline{b}$ and generates $\overline{\overline{a}\ \overline{b}}$. The NAND gate 40 receives signals $\overline{ab}$ and $\overline{\overline{a}\ \overline{b}}$ and generates $ab V \overline{a}\ \overline{b}$ resulting in signal E.

Figure 4:
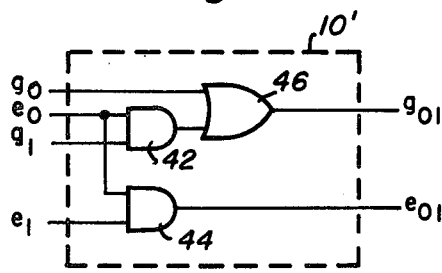
FIG. 4 is an alternative circuit for a cascading circuit used in FIG. 1.

FIG. 4 illustrates an alternative embodiment, referred to by the general reference character 10′, for the cascading circuits 10–16. The network 10′ includes two AND gates 42 and 44 and an OR gate 46. The AND gates 42 and 44 each receive the $e_0$ signal from the one-bit comparator 2. The AND gate 44 also receives the signal $e_1$ from the one-bit comparator 3 while the AND gate 42 receives the $g_1$ signal from the one-bit comparator 3. The two inputs to the OR gate 46 are the $g_0$ signal of the one-bit comparator 2 and the output of the AND gate 42. The signal $g_{01}$ is provided at the output of the OR gate 46 and the signal $e_{01}$ is provided at the output of the AND gate 44. Each of the cascading circuits 10–16 may be replaced with a cascade circuit 10′ and connected as illustrated in FIG. 1.

FIG. 5 shows a functional block diagram of a seven-bit carry generator referred to by the general reference character 50 and incorporating the present invention. The generator 50 is adapted to receive two binary input words A and B comprising $a_0$ to $a_6$ and $b_0$ to $b_6$ respectively, where $a_0$ and $b_0$ are the most significant bits, to be processed. The two binary words A and B, "carry in" signal and a constant signal "1" are supplied to the carry generator 50 which produces two outputs, namely a carry-generate signal G and a carry-propagate signal P, indicating whether a carry signal is generated in the carry generator itself or the carry signal is generated on a condition that the "carry in" signal is logical 1.

The carry generator 50 is comprised of seven one-bit carry generators 51–57 and the seven cascading circuits 10–16 arranged in the three stages. The circuits 51–57 and 10–16 are connected in the tree configuration.

Each of the one-bit carry generators 51 to 57 includes four NAND gates 60–63 and one inverter 64 arranged to generate outputs $G_0$–$G_6$ and $P_0$–$P_6$. The NAND gate 60 receives the $a_i$ and $b_i$ signals. The output of the gate 60 is connected to the NAND gates 61 and 62 and the inverter 64. The NAND gate 61 also receives the signal $a_i$ and the NAND gate 62 also receives the signal $b_i$. The NAND gate 63 receives the outputs of the NAND gates 61 and 62. The signal $G_i$ is reflected at the output of the inverter 64 and the signal $P_i$ is reflected at the output of the NAND gate 63.

The outputs $G_i$ and $P_i$ are expressed as follows, using arbitrary bits of input $a_i$ and $b_i$.

$$G_i = a_i \cdot b_i$$

and $P_i = a_i \oplus b_i$, which may be expressed as $$= a_i \bar{b_i} V \bar{a_i} b_i.$$

Therefore, the carry generate signal G and carry propagate signal P may be expressed as follows:

$$G = G_0 V P_0 G_1 V P_0 P_1 G_2 V P_0 P_1 P_2 G_3 V P_0 P_1 P_2 P_3 \ G_4 V$$

$$P_0 P_1 P_2 P_3 P_4 G_5 V P_0 P_1 P_2 P_3$$
$$P_4 P_5 G_6 V P_0 P_1 P_2 P_3 P_4 P_5 P_6 C_i,$$

$$= G_0 V P_0 \cdot (G_1 V P_1 \cdot (G_2 V P_2 \cdot (G_3 V P_3 \cdot (G_4 V P_4 \cdot (G_5 V P_5 \cdot (G_6 V P_6 C_i)))))),$$

$$= G_0 V P_0 G_1 V (P_0 P_1)(G_2 V P_2 G_3) V (P_0 P_1)(P_2 P_3) \cdot$$

$$[G_4 V P_4 G_5 V (P_4 P_5) G_6 V P_6 C_i)];$$

and $$P = P_0 P_1 P_2 P_3 P_4 P_5 P_6$$
$$= (P_0 P_1)(P_2 P_3)(P_4 P_5)(P_{6 \cdot 1}).$$

In operation of the one-bit carry generators 51–57, the NAND gate 60 generates $\overline{ab}$ and the inverter gate 64 generates the required output a·b. The three NAND gates 61 to 63 are supplied with the $\overline{ab}$ signal and generate the output $a \cdot \overline{ab} \cdot \overline{ab} \cdot b$ which is transformed into $a\bar{b} V \bar{a}b$.

It should be realized that the one-bit carry generators 51–57 shown in FIG. 5 are representative and other equivalent circuits may be used for the purpose.

The illustrated cascading circuits in FIG. 5 are exactly the same as the cascading circuits 10–16 of the eight-bit magnitude comparator of FIG. 1 so that the operation of the cascading circuit 10–16 of FIG. 1 can be applied to the seven-bit carry generator 50. For instance, the cascading circuit 10 in FIG. 5 generate the outputs of $G_{01}$ and $P_{01}$ which are expressed as follows:

$$G_{01} = G_0 V P_0 G_1;$$

and $$P_{01} = P_0 P_1.$$

Similarly, the cascading circuit 11 generates the output of $G_{23}$ and $P_{23}$ which are expressed as follows:

$$G_{23} = G_2 V P_2 G_3;$$

and $$P_{23} = P_2 P_3.$$

The cascading circuit 12 generates the outputs of $G_{45}$ and $P_{45}$ which are expressed as follows:

$$G_{45} = G_4 V P_4 G_5;$$

and $$P_{45} = P_4 P_5.$$

The cascading circuit 13 generates the outputs of $G_{67}$ and $P_{67}$ which are expressed as follows:

$$G_{67} = G_6 V P_6 C_i;$$

and $$P_{67} = P_6.$$

The cascading circuit 14 generates the outputs of $G_{0\text{-}3}$ and $P_{0\text{-}3}$ which are expressed as follows:

$$G_{0\text{-}3} (G_{01} V P_{01} G_{23})$$
$$= G_0 V P_0 G_1 V P_0 P_1 (G_2 V P_2 G_3),$$
$$= G_0 V P_0 G_1 V P_0 P_1 G_2 V P_0 P_1 P_2 G_3;$$

and $$P_{0\text{-}3} = P_{01} \cdot P_{23},$$
$$= P_0 P_1 P_2 P_3.$$

The cascading circuit 15 generates the outputs of $G_{4\text{-}7}$ and $P_{4\text{-}7}$ which are expressed as follows:

$$G_{4\text{-}7} = G_{45} V P_{45} \cdot G_{67},$$
$$= G_4 V P_4 G_5 V P_4 P_5 (G_6 V P_6 C_i),$$
$$= G_4 V P_4 G_5 V P_4 P_5 G_6 V P_4 P_5 P_6 C_i;$$

and $$P_{4\text{-}7} = P_{45} P_{67} = P_4 P_5 P_6.$$

Finally the cascading circuit 16 generates the outputs $G_{0\text{-}7}$ and $P_{0\text{-}7}$ which are expressed as follows:

$$G_{0\text{-}7} = G_{0\text{-}3} \cdot V P_{0\text{-}3} \cdot G_{4\text{-}7},$$
$$= G_0 V P_0 G_1 V (P_0 P_1)(G_2 V P_0 G_3) V (P_0 P_1)$$
$$(P_2 P_3)[G_4 V P_4 G_5 V (P_4 P_5)(G_6 V P_6 C_i)],$$
$$= G;$$

and $$P_{0\text{-}7} = P_{0\text{-}3} \cdot P_{4\text{-}7},$$
$$= P_0 P_1 P_2 P_3 P_4 P_5 P_6,$$
$$= P.$$

It will be seen from FIG. 5 that a three-bit carry generator can be constructed with three one-bit carry generators, e.g., 55, 56 and 57 and three cascading circuits 12, 13 and 15.

An N-bit carry generator can be built by using N one-bit carry generators and cascading circuits. An N-bit carry generator built by using a plurality of unit carry generators is shown in FIG. 6 which illustrates a functional block diagram of a 31-bit carry generator using four carry generators 50. Each of the unit carry generators 50 includes the cascading circuit 16 in the third stage. Only the cascading circuit 16 is shown in FIG. 6 for the sake of simplicity. The carry generators 50 are identical to the seven-bit carry generator 50 shown in FIG. 5; each carry generator 50 including eight one-bit carry generators to receive a pair of eight-bit input signals as $a_0$–$a_7$ and $b_0$–$b_7$. The outputs of the carry generators 50 are supplied to a pair of cascading circuits 70 and 72. Each of the cascading circuits 70 and 72 are provided for two of the carry generators 50. A cascading circuit 74 is provided for generating the final outputs G and P in the final cascading stage. The illustrated cascading circuits 70, 72 and 74 are structurally the same as the cascading circuits 10–16 of FIG. 1.

FIG. 7 shows a functional block diagram of a thirty-two bit parity prediction circuit, referred to by the general reference character 80 incorporating the present invention. The circuit 80 is adapted to receive a binary input word B comprised of $b_0$ to $b_{31}$ where $b_0$ is the most significant bit. The parity prediction circuit 80 is adapted to generate a "flip-parity" signal Pf and an "all-even-bit-1's" signal A1. The parity prediction circuit is a circuit for generating the parity flip signal "Pf" from the input word B without using a result of N-bit binary counter.

Referring to the following table, the data bits $b_0$-$b_{31}$ of the input word B, are listed in a particular arrangement in the left column together with the corresponding parity of the input word. The new parity $P_N$ for the incremented data is listed in the right column. The change of the parity is designated by asterisks in the intermediate column.

| Data Bits | | | | | | | | Parity $P_0$ | Parity flip | New Parity $P_N$ |
|---|---|---|---|---|---|---|---|---|---|---|
| $b_0$ | $b_{25}$ | $b_{26}$ | $b_{27}$ | $b_{28}$ | $b_{29}$ | $b_{30}$ | $b_{31}$ | | | |
| 0 | 0 | 0 | 0 | 0 | 0 | 0 | 0 | 1 | * | 0 |
| 0 | 0 | 0 | 0 | 0 | 0 | 0 | 1 | 0 |   | 0 |
| 0 | 0 | 0 | 0 | 0 | 0 | 1 | 0 | 0 | * | 1 |
| 0 | 0 | 0 | 0 | 0 | 0 | 1 | 1 | 1 | * | 0 |
| 0 | 0 | 0 | 0 | 0 | 1 | 0 | 1 | 1 |   | 1 |
| 0 | 0 | 0 | 0 | 0 | 1 | 1 | 1 | 0 |   | 0 |
| 0 | 0 | 0 | 0 | 1 | 1 | 1 | 1 | 1 | * | 0 |
| 0 | 0 | 0 | 1 | 1 | 1 | 1 | 1 | 0 |   | 0 |
| 0 | 0 | 1 | 1 | 1 | 1 | 1 | 1 | 1 | * | 0 |

It is seen that the parity flip is required when the number of consecutive "1"'s counted from the least significant bit of the data is even, including 0. In addition, if the data bits $b_0$ to $b_{31}$ are all "1," the parity flip is not required. Therefore the Boolean function $F_{31}$, which gives "1" when the number of the consecutive "1"'s is even, can be expressed as follows:

$$F_{31} = \overline{b_{31}} V b_{31} b_{30} \overline{b_{29}} V b_{31} b_{30} b_{29} b_{28} \overline{b_{27}} V b_{31} b_{30} b_{29} b_{28^-}$$
$$b_{27} b_{26} \overline{b_{25}} V b_{31} b_{30} b_{29} b_{28} b_{27} b_{26} b_{25} b_{24} \overline{b_{23}} V b_{31} b_{30} b_{29^-}$$
$$b_{28} b_{27} b_{26} b_{25} b_{24} b_{22} \overline{b_{21}} V \ldots V b_{31} \ldots b_2 \overline{b_1};$$
$$= \overline{b_{31}} V b_{31} b_{30} (\overline{b_{29}} V b_{29} b_{28} \overline{b_{27}} V b_{29} b_{28}$$
$$b_{27} b_{26} \overline{b_{25}} V b_{29} b_{28} b_{27} b_{26} b_{25} b_{24} \overline{b_{23}} V b_{29} b_{28} b_{27} b_{26} b_{25}$$
$$b_{24} b_{23} b_{22} \overline{b_{21}} V b_{29} \ldots b_2 \overline{b_1});$$
$$= \overline{b_{31}} V b_{31} b_{30} (\overline{b_{29}} V b_{29} b_{28} (b_{27} V b_{27} b_{26} \overline{b_{25}} V b_{27}$$
$$b_{26} b_{25} b_{24} V b_{27} b_{26} b_{25} b_{24} b_{23} b_{22} b_{21} \ldots V b_{27} \ldots b_2 \overline{b_1}));$$

$$F_{31} = \overline{b_{31}} V b_{31} b_{30} (\overline{b_{29}} V b_{29} b_{28} (b_{27} V \overline{b_{27}} b_{26} (\overline{b_{25}} V b_{25} b_{24^-}$$
$$(\overline{b_{23}} V b_{23} b_{22} (\overline{b_{21}} V \ldots \overline{b_3} V b_3 b_2 (\overline{b_1}) \ldots ).$$

Applying a Boolean identity $(avab=avb)$ repetitively, the above equation can be reduced to the following:

$$F_{31} = \overline{b_{31}} V b_{30} (\overline{b_{29}} V b_{28} (\overline{b_{27}} V b_{26} (\overline{b_{25}} V b_{24} (\overline{b_{23}} V b_{22}$$
$$\overline{b_{21}} V \ldots \overline{b_3} V b_2 (\overline{b_1}) \ldots ).$$

It is seen that this expression is equivalent to the aforesaid expression for G by replacing $\overline{b_{2K+1}}$ with $g_{15-k}$ and $b_{2K}$ with $e_{15-k}$, where $K = 0, \ldots, 15$. Therefore, the function $F_{31}$ may be constructed by using the cascading circuits 50 and the alternating inputs $\overline{b_{2K+1}}$ and $\overline{b_{2K}}$. The parity prediction circuit 80 of FIG. 7 has eight logic circuits 81–88 in the first stage to which 32 bit signals $b_0$-$b_{31}$ of normal polarity may be received. The cascading circuits 81–88 of the first cascade stage, have been transformed from the cascading circuits 50 which originally had alternating inputs $b_{2K+1}$ and $b_{2K}$, by merely changing the connections to one inverter.

The seven cascading circuits 50 are required to construct the 32-bit parity prediction circuit in order to form the tree circuit.

When a parity prediction circuit for a counter with odd number of bits is to be constructed by using the cascading circuits, logical "0" signals are supplied to the rest of the inputs. For example, assume a five-bit case wherein the binary word has bits $b_0$-$b_4$. The Boolean function $F_4$ is expressed as follows:

$$F_4 = \overline{b_4} V b_3 (\overline{b_2} V b_1 \overline{b_0}),$$
$$= \overline{b_4} V b_3 \overline{b_2} V b_3 b_1 \overline{b_0}.$$

Figure 8:
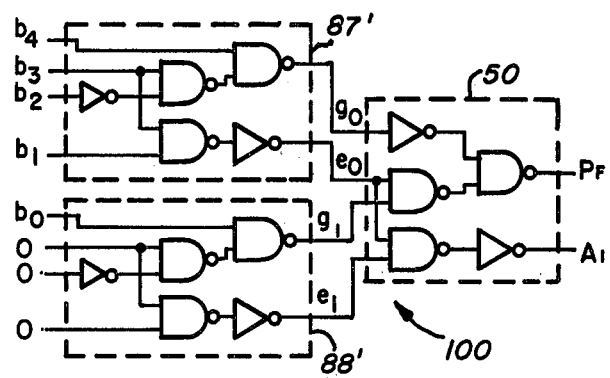
FIG. 8 is a functional block diagram of a five-bit parity prediction circuit in accordance with the present invention.

FIG. 8 illustrates a five-bit parity prediction circuit referred to by the general reference character 100. Two cascading circuits 87' and 88' are tied to a cascade circuit 50 with the circuit 87' receiving bits $b_1, \ldots b_4$ and the circuit 88 receiving the bit $b_0$ and three "0" signals.

When a parity prediction circuit for even number of bits but not a power of 2 is to be constructed by using the cascading circuits, the most significant bit $b_0$ is not supplied and a "0" signal is supplied instead of the $b_0$ bit. For example, assume a six-bit case. The Boolean function $F_5$ will be expressed as follows:

$$F_5 = \overline{b_5} V b_4 (\overline{b_3} V b_2 (\overline{b_1})),$$
$$= \overline{b_5} V b_4 \overline{b_3} V b_4 b_2 \overline{b_1}.$$

Figure 9:
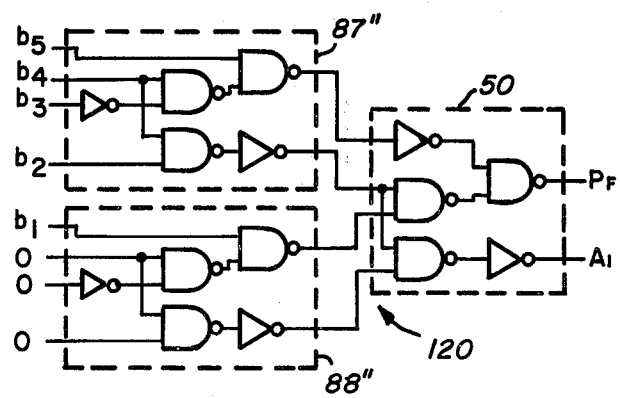
FIG. 9 is a functional block diagram of a six-bit parity prediction circuit in accordance with the present invention.

FIG. 9 illustrates a six-bit parity prediction circuit referred to by the general reference character 120. The circuit 87" receives the bits $b_2, \ldots b_5$ and the circuit 88" receives the $b_1$ and three "0"s.

While the invention has been particularly shown and described with reference to certain preferred embodiments it will be understood by those skilled in the art that various alternatives and modifications in form and detail may be made therein. Accordingly, it is intended that the following claims cover all such alternatives and modifications as fall within the true spirit and scope of the invention.

What is claimed is:

1. A tree-type logic circuit comprising:

a plurality of cascading circuits, each of said cascading circuits having four input terminals, two output terminals and an internal logic circuit, each of said cascading circuits being connected in multi-stages to form a tree, said internal logic circuit having means for generating signals of Boolean function $G_{K*l}=G_K V E_k g_l$ and $E_{K*l}=E_K e_l$ wherein $G_K$ is a signal applied to the first terminal of said four input terminals, $E_K$ is a signal applied to the second terminal of said four input terminals, $g_l$ ($g_{K+1}$) is a signal applied to the third terminal of said four input terminals and $e_l$ ($e_{K+1}$) is a signal applied to the fourth terminal of said four input terminals; where K and $l$ are either an integer between 0 and N-1 or any concatination thereof, and "N" is the total number of input signal paths, "*" means concatination operator for two integers;

first signal generating means for applying first N binary bit input signals $g_0$ to $g_{N-1}$ to said first and third terminals of each of said cascading circuits in the first stage, consecutively; and second signal generating means for applying second N input signals $e_0$ to $e_{N-1}$ to said second and fourth terminals of said cascading circuits in the first stage consecutively.

2. The tree-type logic circuit of claim 1 wherein each of said cascading circuits includes two AND gates and one OR gate.

3. The tree-type logic circuit of claim 1, wherein each of said cascading circuits includes three NAND gates and two inverter gates.

4. The tree-type logic circuit of claim 1 wherein said first signal generating means provides first input signals $g_0$ to $g_{N-1}$ with a plurality of functions $g_0 = a_0 \overline{b_0}$ to $g_{N-1} = a_{N-1} \overline{b_{N-1}}$ and said second signal generating means provides second input signals $e_0$ to $e_{N-1}$ with a plurality of functions $e_0 = a_0$ to $e_{N-1} = a_{N-1} \oplus b_{N-1}$, wherein said input signal $a_0$ to $a_{N-1}$ is $b_{N-1}$ is defined as a second binary input word, with $a_0$ and $b_0$ being the most significant.

5. The tree-type logic circuit of claim 4 wherein said first and second signal generating means includes at least a pair of one-bit comparator circuits each having two input terminals and two output terminals with the two input terminals of one one-bit comparator circuit of the pair connected to receive said bits $a_0$ and $b_0$, the two input terminals of the other one-bit comparator circuit of the pair connected to receive said bits $a_1$ and $b_1$, the output terminals of said one one-bit comparator circuit connected to the first and third input terminals of one of said cascading circuits in the first stage; and the output terminals of said other one-bit comparator circuit connected to the second and fourth input terminals of said one of said cascading circuits.

6. The tree-type circuit of claim 5 wherein,
one one-bit comparator circuit of said pair of one-bit comparator circuits includes two NAND gates, an inverter and an AND-OR-INVERTER gate with a first of said NAND gates connected to receive the bits $a_0$ and $b_0$, the second of said NAND gates connected to receive the bit $a_0$ and the output of said first NAND gate, the AND-OR-INVERTER gate connected to receive the bit $b_0$ and the output of said first NAND gate, the input of the inverter connected to receive the output of the second NAND gate and the output of the inverter connected to the first input terminal of one of said cascade circuits, the output of the AND-OR-INVERTER gate connected to the second input terminal of one of said cascade circuits; and wherein
the other one-bit comparator circuit of said pair of one-bit comparator circuits includes two NAND gates, an inverter, and an AND-OR-INVERTER gate, with a first of said NAND gates connected to receive bits $a_1$ and $b_1$, the second of said NAND gates connected to receive bit $a_1$ and the output of said first NAND gate, and the AND-OR-INVERTER gate connected to receive the bit $b_1$ and the output of said first NAND gate, the input of the inverter connected to receive the output of the second NAND gate and the output of the inverter connected to the third input terminal of said one of said cascade circuits, and the output of the AND-OR-INVERTER gate connected to the fourth input terminal of said one of said cascade circuits.

7. The tree-type circuit of claim 5 wherein,
one one-bit comparator circuit means includes four NAND gates and two inverter gates with a first NAND gate connected to receive the bits $a_0$ and $b_0$, the second NAND gate connected to receive the bit $a_0$ and the output of the first NAND gate, the third NAND gate connected to receive the bit $b_0$ and the output of the first NAND gate, the fourth NAND gate connected to receive the output of the second and third NAND gates, the first inverter connected to receive the output of the second NAND gate, the second inverter connected to receive the output of the fourth NAND gate, the outputs of the first and second inverter connected to the first and second input terminals, respectively, of one of said cascade circuits; and wherein
the other one-bit comparator circuit of said pair of one-bit comparator circuits includes four NAND gates and two inverter gates with a first NAND gate connected to receive the bits $a_1$ and $b_1$, the second NAND gate connected to receive the bit $a_1$ and the output of the first NAND gate, the third NAND gate connected to receive the bit $b_1$ and the output of the first NAND gate, the fourth NAND gate connected to receive the output of the second and third NAND gates, the first inverter connected to receive the output of the second NAND gate, the second inverter connected to receive the output of the fourth NAND gate, the outputs of the first and second inverters connected to the third and fourth input terminals, respectively, of said one of said cascade circuits.

8. The tree-type logic circuit of claim 1 wherein said first signal generating means provides first input signals $g_0$ to $g_{N-1}$ with a plurality of functions $g_0 = a_0 \cdot b_0$ to $g_{N-1} = a_{N-1} \cdot b_{N-1}$ and said second signal generating means provides second input signals $e_0$ to $e_{N-1}$ with a plurality of functions $e_0 = a_0 \oplus b_0$ to $e_{N-1} = a_{N-1} \oplus b_{N-1}$, wherein said input signal $a_0$ to $a_{N-1}$ is defined as a first binary input word and said input signal $b_0$ to $b_{N-1}$ is defined as a second binary input word, with $a_0$ and $b_0$ being the most significant bits.

9. The tree-type circuit of claim 8 wherein,
said first and second signal generating means includes at least a pair of one-bit carry generator circuits each having two input terminals and two output terminals, one one-bit carry generator circuit of said pair includes four NAND gates, and an inverter, the first of said NAND gates being connected to the input terminals to receive the input bits $a_0$ and $b_0$, the second NAND gate connected to receive the bit $a_0$ and the output of the first NAND gate, the third NAND gate connected to receive the bit $b_0$ and the output of the first NAND gate, the fourth NAND gate connected to receive the output of the second and third NAND gates, the inverter connected to receive the output of the first NAND gate, the outputs of the inverter and fourth NAND gate connected to the output terminals which are in turn connected to the first and secone input terminals, respectively, of one of said cascade circuits; and wherein
the other one-bit carry generator circuit of said pair includes circuitry the same as the circuitry of said one one-bit carry generator circuit with the input terminals connected to receive the bits $a_1$ and $b_1$ and the output terminals connected to the third and fourth input terminals, respectively, of said one of said cascade circuits.

10. The tree-type logic circuit of claim 1, wherein said first signal generating means provides first input signals $g_0$ to $g_{N-1}$ with a plurality of Boolean functions $g_K = \bar{b}_{4(N-K)-1} \vee b_{4(N-K)-2} \cdot b_{4(N-K)-3}$ and said second signal generating means provides second input signals $e_0$ and $e_{N-1}$ with a plurality of Boolean functions $e_K = b_{4(N-K)-2} \cdot b_{4(N-K)-3}$, wherein K is an arbitrary integer starting from 0, with the convention that $b_i$'s with negative indices means logical "0."

11. The tree-type circuit of claim 10 wherein,
said first and second signal generating means includes at least a pair of parity predictor circuits each having four input terminals to receive four binary bits of a binary word and two output terminals, one parity predictor circuit of said pair includes three NAND gates and two inverter gates, the first NAND gate connected to the first and second of said input terminals, the input of first inverter connected to the third of said input terminals, the second NAND gate connected to the output of the first NAND gate and the second of said input terminals, the third NAND gate connected to the fourth input terminals and the output of the second NAND gate, the second inverter connected to the output of the first NAND gate, said two output terminals being connected to the output of the third NAND gate and second inverter; and the first and second input terminals, respectively, of one of said cascade circuits; and wherein the other parity predictor circuit of said pair includes circuitry the same as the circuitry of said one parity predictor circuit with the input terminals connected to receive four binary bits, and the two output terminals connected to the third and fourth input terminals, respectively, of said one of said cascade circuits.

12. The tree-type logic circuit of claim 1 wherein the number of cascading circuits in each stage is one half the number of cascading circuits in the preceding stage of the tree.

13. The tree-type logic circuit of claim 12 wherein the last stage of the tree consists of one cascading circuit.

* * * * *